US006960511B2

(12) United States Patent
Ito et al.

(10) Patent No.: US 6,960,511 B2
(45) Date of Patent: Nov. 1, 2005

(54) SEMICONDUCTOR DEVICE AND METHOD OF MANUFACTURING THE SAME

(75) Inventors: Hiroyasu Ito, Nagoya (JP); Toshimasa Yamamoto, Ama-gun (JP)

(73) Assignee: Denso Corporation, Kariya (JP)

( * ) Notice: Subject to any disclaimer, the term of this patent is extended or adjusted under 35 U.S.C. 154(b) by 43 days.

(21) Appl. No.: 10/642,889

(22) Filed: Aug. 18, 2003

(65) Prior Publication Data

US 2004/0077108 A1    Apr. 22, 2004

Related U.S. Application Data

(63) Continuation of application No. 09/340,020, filed on Jun. 28, 1999, now abandoned.

(30) Foreign Application Priority Data

Jun. 29, 1998 (JP) .................................. 10-182731

(51) Int. Cl.[7] .......................................... H01L 21/336
(52) U.S. Cl. ................................... 438/289; 257/335
(58) Field of Search .............................. 438/197, 212, 438/268, 282, 289, FOR 192, FOR 176; 257/335, 339, 340, 343

(56) References Cited

U.S. PATENT DOCUMENTS

| | | | |
|---|---|---|---|
| 4,750,024 A | 6/1988 | Schreck | 357/23.5 |
| 5,141,880 A | 8/1992 | Inoue et al. | 437/29 |
| 5,192,872 A | 3/1993 | Lee | 257/315 |
| 5,304,827 A | 4/1994 | Malhi et al. | 257/262 |
| 5,313,082 A | 5/1994 | Eklund | |
| 5,366,916 A * | 11/1994 | Summe et al. | 438/217 |
| 5,382,536 A | 1/1995 | Malhi et al. | 437/41 |
| 5,382,821 A | 1/1995 | Nakajima | 257/401 |
| 5,501,994 A | 3/1996 | Mei | 437/40 |
| 5,548,147 A | 8/1996 | Mei | 257/333 |
| 5,777,365 A * | 7/1998 | Yamaguchi et al. | 257/347 |
| 5,811,850 A | 9/1998 | Smayling et al. | 257/335 |
| 5,917,217 A | 6/1999 | Kitamura et al. | 257/343 |
| 5,929,478 A | 7/1999 | Parris et al. | 257/314 |
| 6,025,231 A | 2/2000 | Hutter et al. | 438/268 |
| 6,025,237 A | 2/2000 | Choi | 438/301 |
| 6,160,290 A * | 12/2000 | Pendharkar et al. | 257/339 |

OTHER PUBLICATIONS

Wolf, "Silicon Processing for the VLSI Era," 1990, p. 66–67.

* cited by examiner

Primary Examiner—David Vu
(74) Attorney, Agent, or Firm—Harness, Dickey & Pierce, PLC

(57) ABSTRACT

A semiconductor device, which can prevent a current capability from deteriorating with time, is disclosed. A P-channel type LDMOS is formed in an N-type monocrystal silicon substrate. The P-channel type LDMOS includes: a P-type impurity diffusion layer formed in a well shape so as to reach a predetermined depth; a channel well layer formed by double-diffusing N-type impurities; a source diffusion layer; a potential fixing electrode; drain-contact electrode; a LOCOS oxide film; a gate electrode; a drain electrode; a source electrode; and so on. Especially, the gate electrode is formed so as to overlap onto the LOCOS oxide film, and its protrusion amount onto the LOCOS oxide film (gate overlap length O/L) is set to about 10 μm, which is substantially ½ of a width size of the LOCOS oxide film.

30 Claims, 12 Drawing Sheets

O/L = 10μm

O/L = 7μm

SEMICONDUCTOR DEVICE AND METHOD OF MANUFACTURING THE SAME

This application is a division of Ser. No. 09/340,020 filed on Jun. 28, 1999 abandoned.

CROSS REFERENCE TO RELATED APPLICATION

This application is based upon Japanese Patent Application No. Hei. 10-182731 filed on Jun. 29, 1998, the contents of which are incorporated herein by reference.

BACKGROUND OF THE INVENTION

1. Field of the Invention

This invention relates to a semiconductor device and method of manufacturing a semiconductor, especially to a semiconductor having an insulating isolation film between a source and a drain, and method of manufacturing a semiconductor having a switching function using a semiconductor wafer.

2. Related Art

An LDMOS (Lateral Double-diffused Metal Oxide Semiconductor) is proposed as a MOSFET having a high withstand voltage. FIG. 15 is a schematic diagram illustrating a basic structure of a P-channel type LDMOS 1. In FIG. 15, a P-type impurity diffusion layer 3 is formed in an N-type monocrystal silicon substrate 2, and performs as a drift layer of the LDMOS 1. A channel well layer 4 is formed in the impurity diffusion layer 3 by double-diffusing N-type impurities. A source diffusion layer 5 is formed in the channel well layer 4 by diffusing high concentration P-type impurities thereto. Also a potential fixing diffusion layer 6 for fixing a voltage is formed in the channel well layer 4 by diffusing high concentration N-type impurities thereto. A drain-contact layer 7 is formed in the impurity diffusion layer 3 by diffusing high concentration P-type impurities thereto. Between the channel well layer 4 and the drain-contact layer 7 on the impurity diffusion layer 3, a LOCOS oxide film 8 is formed as an insulating isolation film to electrically insulate each other.

On a channel forming region 4a of the channel well layer 4, a gate electrode 9 made of a polysilicon is formed with a gate oxide film 10 interposed therebetween. The gate electrode 9 is formed so that a part of it overlaps onto the LOCOS oxide film 8, that is, a part of it is protruded onto the LOCOS oxide film 8. Furthermore, a drain electrode 11 is ohmic-contacted onto the drain-contact layer 7, and a source electrode 12 is ohmic-contacted onto both of the source diffusion layer 5 and the potential fixing diffusion layer 6.

Here, a power switching element such as the LDMOS 1 is used for a system including the LDMOS 1 and its control circuit, or for a semiconductor device consisting by combining the LDMOS 1 and the control circuit. In this case, in order to evaluate a characteristic of the system or the semiconductor device, a burn-in test, in which a signal for actual operation is applied to the LDMOS 1 while a bias voltage having a rated voltage or more is applied between the source and the drain, is conducted in the final step of the manufacturing procedure, and then characteristic examination is conducted to detect a quality of the element which is deteriorating with time.

Here, in the LDMOS 1 as shown in FIG. 15, both a withstand voltage and a current capability are improved by adequately modifying structural parameters such as an impurity concentration of the impurity diffusion layer 3, an impurity concentration or a junction depth of the channel well layer 4, width size of the LOCOS oxide film 8, a gate overlap length of the gate electrode 9 shown as O/L in FIG. 15 and soon. For example, when the gate overlap length is adequately modified, relations between the gate overlap length and the drain withstand voltage of the LDMOS 1 as shown in FIG. 16A, and between the gate overlap length and the drain current as shown in FIG. 16B are referred. Here, FIGS. 16A, 16B show an example of LOCOS oxide film 8 whose width size is 20 $\mu$m. In the case when the characteristics shown in FIGS. 16A, 16B are obtained, the gate overlap length O/L is determined to, for example, around 7 $\mu$m.

However, when a burn-in test is conducted on a semiconductor device, which is integrally formed by combining such a LDMOS 1 in which the gate overlap length is adequately modified and a circuit element for controlling the LDMOS 1, it is found that a current capability decrease after conduct of the burn-in test.

To investigate such a phenomenon that the current capability decrease, a bias voltage the same as that in the burn-in test, for example, a bias voltage in which the LDMOS 1 maintains OFF condition even if a temperature of LDMOS 1 rises to substantially 125° C., is applied to the LDMOS 1. In this situation, changes of a relation between a drain voltage and a drain current, and changes of a threshold voltage are measured before and after the application of the bias voltage.

As shown in FIGS. 17A, 17B, it has been found that the threshold voltage values reflect no change between the values measured before and after the application of the bias voltage, whereas the drain current decreases. These results indicate the main factor resulting in the decreased drain current is not decreased threshold voltage, but rather other unknown factors.

SUMMARY OF THE INVENTION

This invention has been conceived in view of the background thus far described and its first object is to efficiently restrain deterioration with time of a current capability in a semiconductor having a MOS structure. Its second object is to obtain a method of manufacturing a semiconductor having a switching function, which can restrain deterioration with time of a current capability of the semiconductor.

According to the present invention, a gate electrode is formed so as to meet the following condition. That is, when a predetermined bias voltage is applied between a source diffusion layer and a drain-contact layer, and further the source diffusion layer and the gate electrode are substantially at identical potential, a maximum electric field point in the neighborhood of a surface of a semiconductor substrate occurs at substantially the center portion of a region corresponding to an insulating isolation film.

Thus, a change rate of a drain current between before and after an application of a bias voltage, which maintains the semiconductor device to OFF condition, indicates positive value. That is, it can prevent the drain current from decreasing. Consequently, it can prevent the current capability from deteriorating with time even after a long time continuous operation such as the burn-in test.

BRIEF DESCRIPTION OF THE DRAWINGS

These and another objects, features and characteristics of the present invention will be appreciated from a study of the following detailed description, the appended claims, and drawings, all of which form a part of this application. In the drawings, same portions or corresponding portions are put the same numerals each other to eliminate redundant explanation. In the drawings:

DESCRIPTION OF THE PREFERRED EMBODIMENTS

[First Embodiment]

A first embodiment of the present invention will be explained hereafter with reference to accompanying drawings. Here, in this embodiment, a first conductivity type is P-type, a second conductivity type is N-type, however, they may be reversed.

Figure 1:
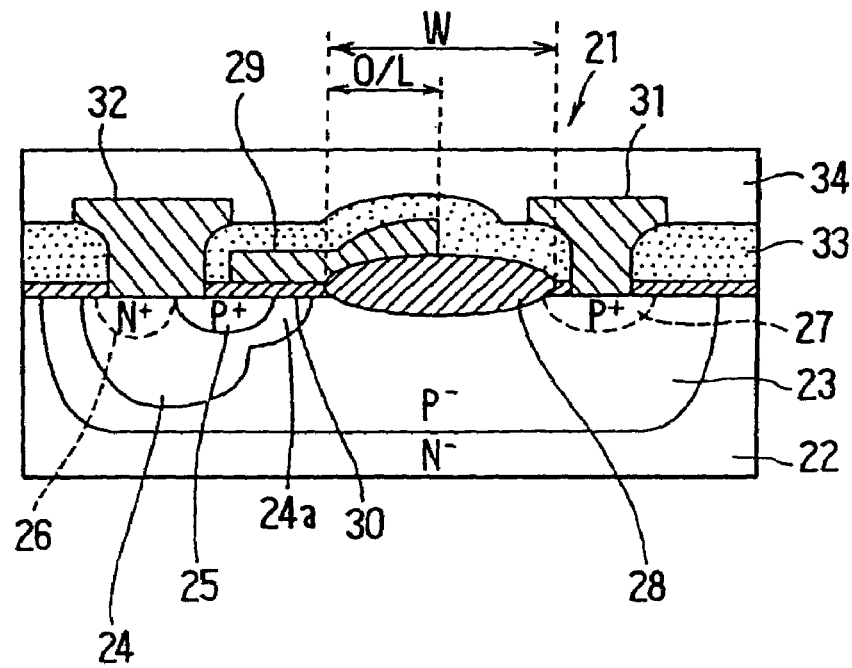
FIG. 1 is a schematic sectional view of a semiconductor device of a First Embodiment according to the present invention.

FIG. 1 schematically shows a basic structure of a P-channel type LDMOS 21 as a semiconductor device. A P-type impurity diffusion layer 23 is formed in an N-type monocrystal silicon substrate 22 in a manner the P-type impurity diffusion layer 23 forms well shape reaching a predetermined depth. An impurity concentration of the impurity diffusion layer 23 is set relatively low, because the impurity diffusion layer 23 is required to have high resistance to perform as a drift layer of the LDMOS 21.

A channel well layer 24 is formed in the monocrystal silicon substrate 22 by double-diffusing N-type impurities from a surface side of the impurity diffusion layer 23 so that a PN junction is generated between the channel well layer 24 and the impurity diffusion layer 23. Here, a junction depth of the channel well layer 24 is set to shallow compared to that of the impurity diffusion layer 23.

A source diffusion layer 25 and a potential fixing diffusion layer 26 are formed in the channel well layer 24. The source diffusion layer 25 is formed by diffusing high concentration P-type impurities. The potential fixing diffusion layer 26 fixes a potential of the channel well layer 24, and is formed by diffusing high concentration N-type impurities. In this case, a P-channel will be generated at a channel forming region 24a where between the source diffusion layer 25 and the PN junction among the impurity diffusion layer 23.

A drain-contact layer 27 is formed in the impurity diffusion layer 23 by diffusing high concentration P-type impurities. A LOCOS oxide film 28 is formed on the impurity diffusion layer 23 between the channel well layer 24 and the drain-contact layer 27. The LOCOS oxide film 28 is an insulating isolation film for electrically insulating between the channel well layer 24 and the drain-contact layer 27. In this embodiment, the width size W of the LOCOS oxide film 28 is set to around 20 $\mu$m.

A gate electrode 29 made of polysilicon is formed on the channel forming region 24a of the channel well layer 24 with a gate oxide film 30 interposed therebetween. This gate electrode 29 is formed in a manner that a part of it overlaps onto the LOGOS oxide film 28, that is a part of it is protruded onto the LOGOS oxide film 28. In this case, a protrusion amount (hereinafter, called "gate overlap length" shown as O/L in FIG. 1) of the gate electrode 29 onto the LOGOS oxide film 28 is set to substantially 10 $\mu$m, which is ½ (a half) of the width size W of the LOGOS oxide film 28.

A drain electrode 31 made of so-called a first aluminum is formed on the drain-contact layer 27 so as to have an ohmic-contact therebetween. A source electrode 32 made of the first aluminum is formed on the source diffusion layer 25 and the potential fixing diffusion layer 26 so as to have an ohmic-contact therebetween.

An interlayer insulating film 33 made of a silicon oxide film is formed so as to cover the LOGOS oxide film 28 and gate electrode 29 and so on. Furthermore, a final passivation film 34 is formed so as to cover the interlayer insulating film 33, the drain electrode 31, and the source electrode 32.

According to the above-mentioned structure, the following operations and effects are obtained.

Figure 2:
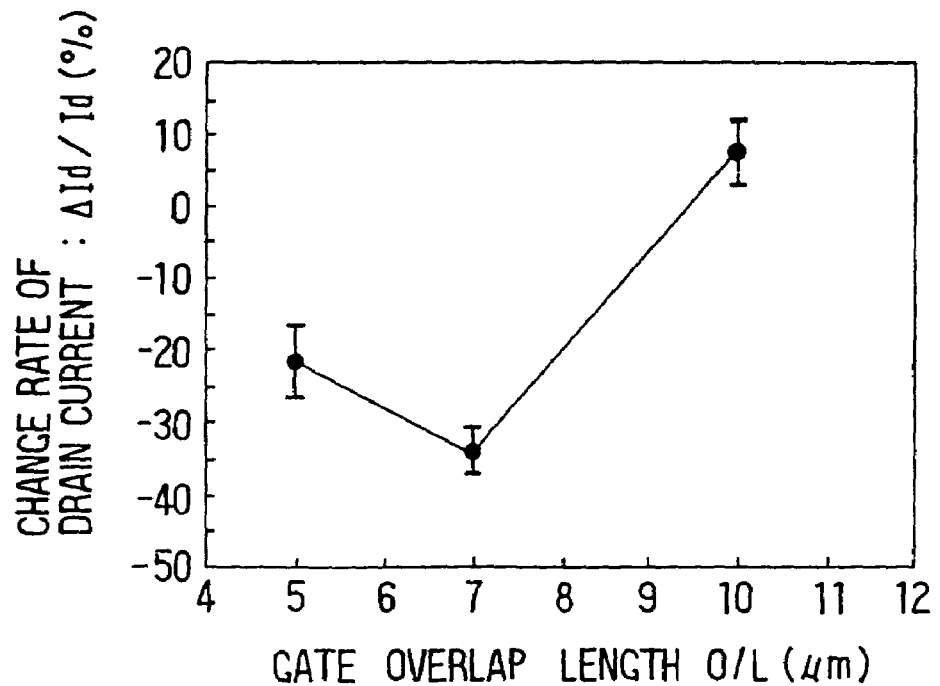
FIG. 2 is a graph illustrating a relation between a gate overlap length O/L and a change rate of a drain current between before and after the application of a bias voltage.

When LDMOS 21 is formed so that its overlap length O/L of the gate electrode 29 with respect to the. LOCOS oxide film 28 is set a half of the width size W of the LOCOS oxide film 28 (W=20 $\mu$m, O/L=10 $\mu$m), the change rate of the drain current between before and after the application of the bias voltage, which maintains the LDMOS 21 to OFF condition, indicates positive value, as shown in FIG. 2. Therefore, according to this embodiment, it can prevent the drain current from decreasing with respect to an initial value in the situation in which the LDMOS 21 is turned on. Consequently, it can prevent the current capability from deteriorating with time even after a long time continuous operation such as the burn-in test.

In this case of the LDMOS 21 structured as described above, it is found that the following phenomena (1) to (3) occur when a bias is applied so as to maintain the LDMOS 21 with OFF condition.

Figure 3:
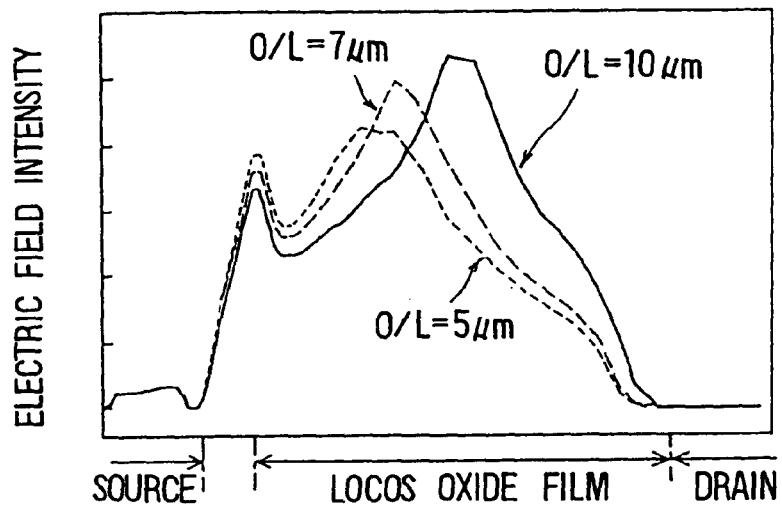
FIG. 3 is a diagram illustrating an electric field intensity distribution in a biased situation.

(1) As shown in FIG. 3, a maximum electric field point in the neighborhood of the surface of the monocrystal silicon 22 occurs at substantially the center portion of a region corresponding to the LOCOS oxide film 28.

Figure 4A:
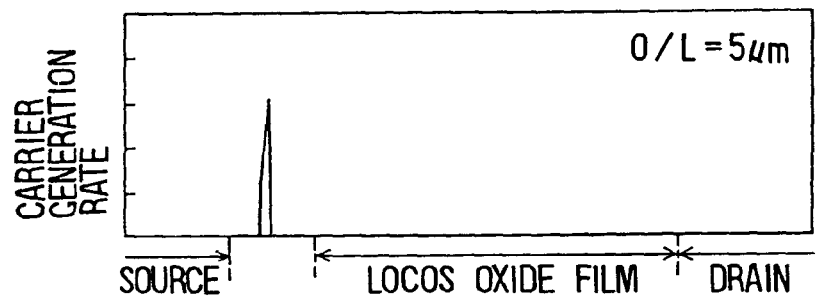
FIGS. 4A–4C are diagrams illustrating a hot carrier distribution in a biased situation.
Figure 4B:
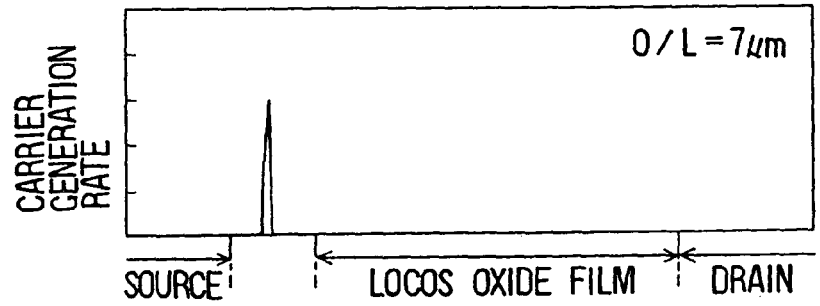
Figure 4C:
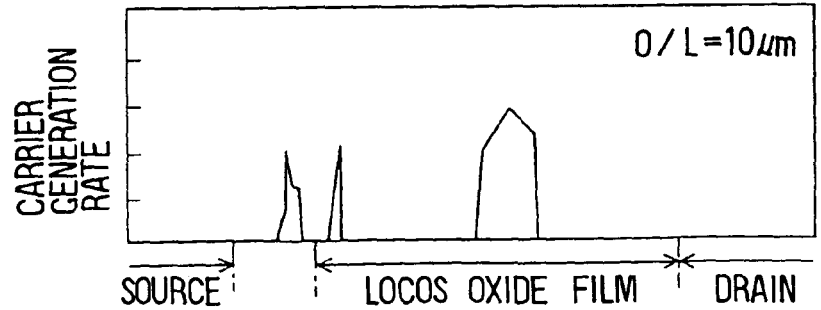

(2) As shown in FIGS. 4A–4C, a peak of hot carrier generation rate in the neighborhood of the surface of the monocrystal silicon 22 occurs at lower region (especially at substantially the center portion of it) corresponding to the LOCOS oxide film 28. Here, each of FIGS. 4A–4C indicates O/L=5 $\mu$m, O/L=7 $\mu$m, O/L=10 $\mu$m, respectively.

Figure 5A:
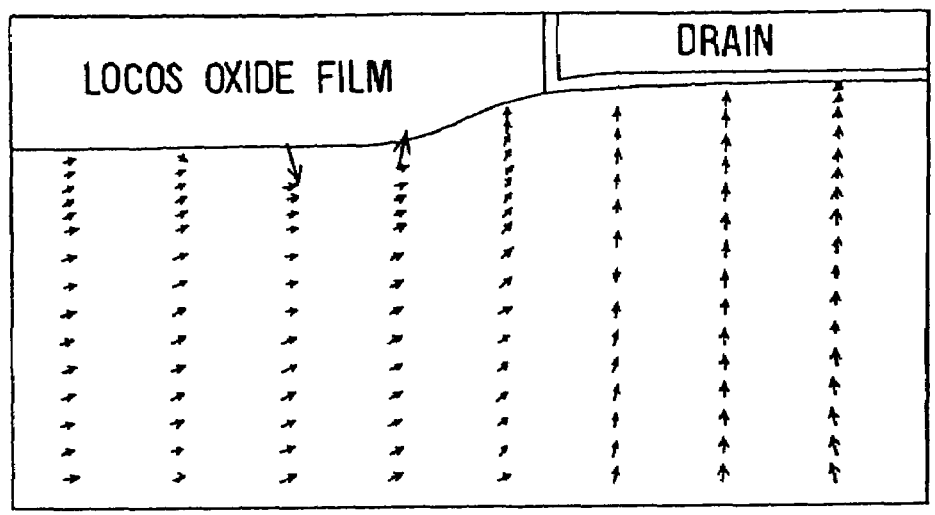
FIGS. 5A–5B are diagrams illustrating a flow of the hot carrier in a biased situation.
Figure 5B:
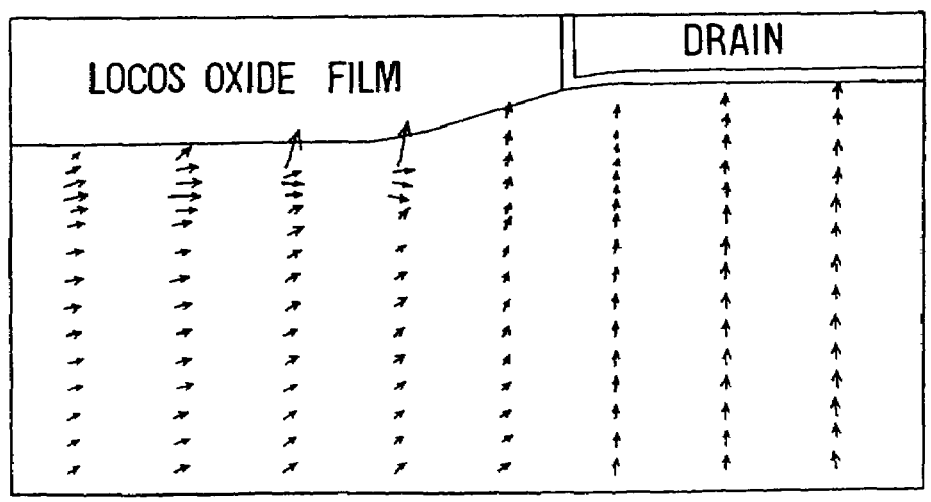

(3) As shown in FIGS. 5A–5B, the hot carrier flow in the neighborhood of the surface of the monocrystal silicon substrate 22 (especially, in the neighborhood of surface corresponding to the LOGOS oxide film 28 and a lower region of the drain-contact layer 27) contains a vertically negative, component (in a direction away from the LOGOS oxide film 28 and into the monocrystal silicon substrate 22) below the LOGOS oxide film 28.

Therefore, by setting the gate overlap length O/L of the gate electrode 29 with respect to the LOCOS oxide film 28 to a half of the width size W of the LOCOS oxide film 28, it will not be essential to construct a semiconductor which can obtain the phenomenons (1) to (3). For example, it can restrict deterioration with time of the current capability by changing a shape of the gate electrode 29 that can obtain the phenomenons (1) to (3). Reasons of this will be explained hereinafter.

FIG. 2 shows change rates (when an initial drain current is Id and after biased drain current is $\Delta$Id, the change rate is represented by $\Delta$Id/Id) of the drain current between before and after the application of the bias voltage, which can maintain the LDMOS 21 to OFF condition, to the LDMOS 21. In this measurement, a measured LDMOS 21 is constructed by setting the width size of the LOCOS oxide film 28 to 20 $\mu$m, and its gate overlap length O/L of the gate electrode 29 is stepwisely changed.

As understood from FIG. 2, the change rate of the drain current depends on the gate overlap length O/L. It is found that the current change rate is equal to or more than minus 20% when the gate overlap length O/L is equal to or less than 8 $\mu$m, whereas the O/L is around 10 $\mu$m (that is, the O/L is substantially equal to a half of the width size of the LOCOS oxide film 28), the current change rate indicates positive value so that the drain current increases. More concretely, the current change rate indicates positive value from the gate overlap length O/L=9.5 $\mu$m, that is 0.475 of the width size of the LOCOS oxide film 28. Furthermore, it is thought that the current change rate indicates positive value, when a ratio of the gate overlap length O/L and the width size of the LOCOS oxide film 28 is more than ½.

In order to investigate a mechanism that the change rate of the drain current between before and after the application of the bias, voltage depends on the gate overlap length O/L, an electric field intensity distribution in the neighborhood of the surface of the monocrystal silicon substrate 22 during an application of the bias, which can maintain the LDMOS 21 to OFF condition, is calculated. This measurement is conducted in plural situations in which the gate overlap length O/L is stepwisely changed. FIG. 3 shows results of the calculation.

According to FIG. 3, when the O/L is set to 5 $\mu$m and 7 $\mu$m (the samples that the current change rate during the application of the bias voltage indicates negative value), the peak (maximum electric field point) of the electric field intensity distribution described above is shifted from the central portion of the LOGOS oxide film 28 to the source diffusion layer 25 side. However, when the O/L is set to 10 $\mu$m (the samples that the current change rate during the application of the bias voltage indicates positive value), the maximum electric field point in the neighborhood of the surface of the monocrystal silicon substrate 22 occurs at a substantially central portion of a region corresponding to the LOGOS oxide film 28.

Therefore, in a semiconductor device having a MOS structure, when the gate electrode is formed so that the maximum electric field point in the neighborhood of the surface of the LDMOS 21 (semiconductor device) between the source diffusion layer 25 and drain-contact layer 27 occurs at substantially central portion of the region corresponding to the LOCOS oxide film 28 (insulating isolation film) when a predetermined bias voltage is applied between the source and the drain, and the source and the gate are identical potential (the semiconductor is turned off), the following effects are obtained. That is, in the above structure, the same phenomenon as that of the structure, in which the gate overlap length O/L is set 10 $\mu$m (the current change rate indicates positive as shown in FIG. 2), is obtained so that it can effectively restrain or improve the deterioration with time of the current capability.

Furthermore, in order to investigate the mechanism that the change rate of the drain current between before and after the application of the bias voltage depends on the gate overlap length O/L, the hot carrier (hot hole) generation rate in the neighborhood of the surface of the monocrystal silicon substrate 22 during an application of the bias, which can maintain the LDMOS 21 to OFF condition, is calculated. This measurement is conducted in plural situations in which the gate overlap length O/L is stepwisely changed. FIGS. 4A–4C show results of the calculation.

According to FIGS. 4A–4C, when the O/L is set to 5 $\mu$m and 7 $\mu$m (the samples that the current change rate during the application of the bias voltage indicates negative value), the peak of the hot carrier generation rate described the above occurs at the region corresponding to a region between the LOCOS oxide film 28 and the source diffusion layer 25. However, when the O/L is set to 10 $\mu$m (the samples that the current change rate during the application of the bias voltage indicates positive value), the peak of hot carrier generation rate occurs at a lower region corresponding the LOCOS oxide film 8 (especially, the central portion of the region).

Therefore, in a semiconductor device having a MOS structure, when the gate electrode is formed so that the maximum point of the hot carrier generation rate in the neighborhood of the surface of the LDMOS 21 (semiconductor device) between the source diffusion layer 25 and drain-contact layer 27 occurs at the lower region of the LOCOS oxide films 28 when a predetermined bias voltage is applied between the source and the drain, and the source and the gate are same potential (the semiconductor is turned off), the following effects are obtained. That is, in the above structure, the same phenomenon as that of the structure, in which the gate overlap length O/L is set 10 μm (the current change rate indicates positive as shown in GIF. 2), is obtained so that it can effectively restrain or improve the deterioration with time of the current capability.

Furthermore, in order to investigate the mechanism that the change rate of the drain current between before and after the application of the bias voltage depends on the gate overlap length O/L, the flow of the carrier in the monocrystal silicon substrate 22 during an application of the bias, which can maintain the LDMOS 21 to OFF condition, is calculated. This measurement is conducted in plural situations in which the gate overlap length O/L is stepwisely changed. FIGS. 5A–5B show results of O/L=7 μm and O/L=10 μm.

According to FIGS. 5A, 5B, in the case the O/L is set to 7 μm (the samples that the current change rate during the application of the bias voltage indicates negative value), the hot carrier flow in the neighborhood of the surface of the monocrystal silicon substrate 22 (especially, neighborhood of the surface corresponding to lower region of the LOCOS oxide film 28 and the drain-contact layer 27) consists of a positive horizontal component toward the drain-contact layer 27 and a positive vertical component toward the upward (toward the LOCOS oxide film 28 side). On the contrary, in the case that the O/L is set to 10 μm (the samples that the current change rate during the application of the bias voltage indicates positive value), the hot carrier flow in the neighborhood of the surface of the monocrystal silicon substrate 22 includes not only the positive horizontal component and the positive vertical component but also a negative vertical component toward downward (opposite direction to the LOCOS oxide film 28 side).

Figure 6:
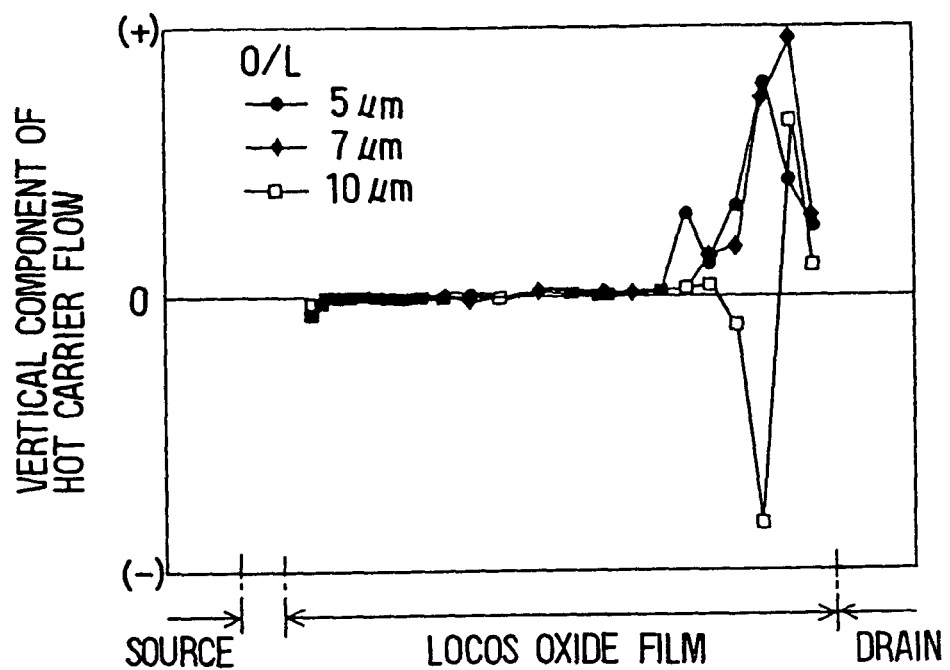
FIG. 6 is a diagram illustrating a vertical component of the hot carrier flow at a surface region of a semiconductor substrate in the biased situation.

FIG. 6 shows calculated vertical component of the hot carrier flow at the neighborhood of the monocrystal silicon substrate 2 during application of the bias voltage described above, at each gate overlap length.

According to FIG. 6, in the case the O/L is set to 5 μm and 7 μm (the samples that the current change rate during the application of the bias voltage indicates negative value), each of the hot carrier flows at the neighborhood of the surface of the monocrystal silicon substrate 22 includes a relatively large positive horizontal component. On the contrary, in the case the O/L is set to 10 μm (the samples that the current change rate during the application of the bias voltage indicates positive value), the hot carrier flow in the neighborhood of the surface of the monocrystal silicon substrate 22 includes a relatively large positive vertical component and a negative vertical component (opposite direction to the LOCOS oxide film 28 side) equal to or larger than the positive vertical component.

Therefore, in a semiconductor device having a MOS structure, when the gate electrode is formed so that the carrier flowing in the neighborhood portion of an interface with the LOCOS oxide film in the impurity diffusion layer 23 includes a component having an opposite direction to the LOCOS oxide film 28 side in the neighborhood of the drain-contact layer 27, the same phenomenon as that of the structure, in which the gate overlap length O/L is set 10 μm (the current change rate indicates positive as shown in GIF. 2), is obtained so that it can effectively restrain or improve the deterioration with time of the current capability.

Furthermore, according to FIG. 2, when the current change rate indicates positive value, a ratio of the gate overlap length O/L (=10 μm) and the width size of the LOCOS oxide film 28 (=20 μm) is ½. Therefore, the protrusion amount (that is, overlap length) is set to about ½ of the width size of the LOCOS oxide film 28, the current change rate indicates positive as shown in GIF. 2, and then it can effectively restrain or improve the deterioration with time of the current capability.

[Second Embodiment]

Figure 7:
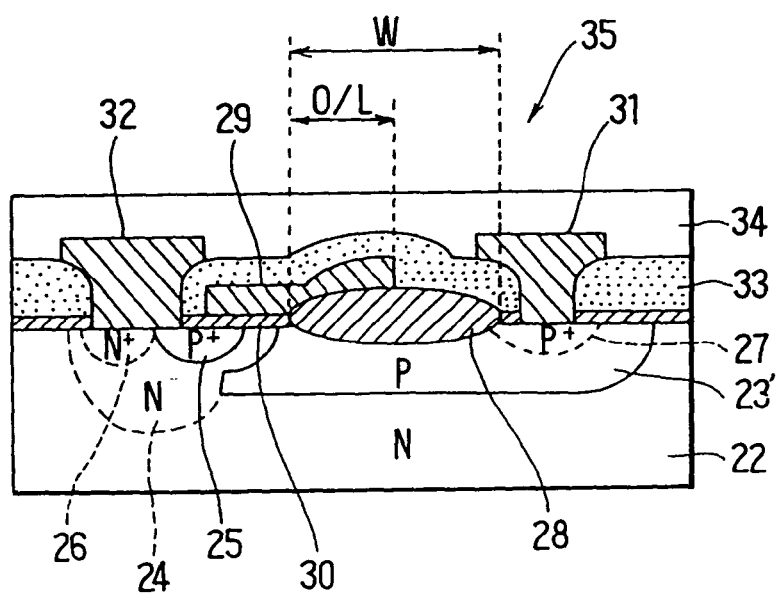
FIG. 7 is a schematic sectional view of a semiconductor device of a Second Embodiment according to the present invention.

FIG. 7 shows a second embodiment, which can obtain the same effects as the first embodiment.

In this embodiment, the present invention is adopted to a LDMOS 35 having a so-called offset drain structure, in which a junction depth of an impurity diffusion layer 23' is set shallow compared to that of the channel well layer 24. Here, the gate overlap length O/L of this embodiment is also set to 10 μm, that is ½ (a half) of the width size W of the LOCOS oxide film 28.

This kind of LDMOS 35 having the offset drain structure is likely to decrease its current capability after the burn-in test compared to the LDMOS 21 in the first embodiment. However, by setting the gate overlap length O/L of the gate electrode 29 is set ½ of the width size W of the LOCOS oxide film 28, it can effectively restrain or improve the deterioration with time of the current capability.

[Third Embodiment]

Figure 8:
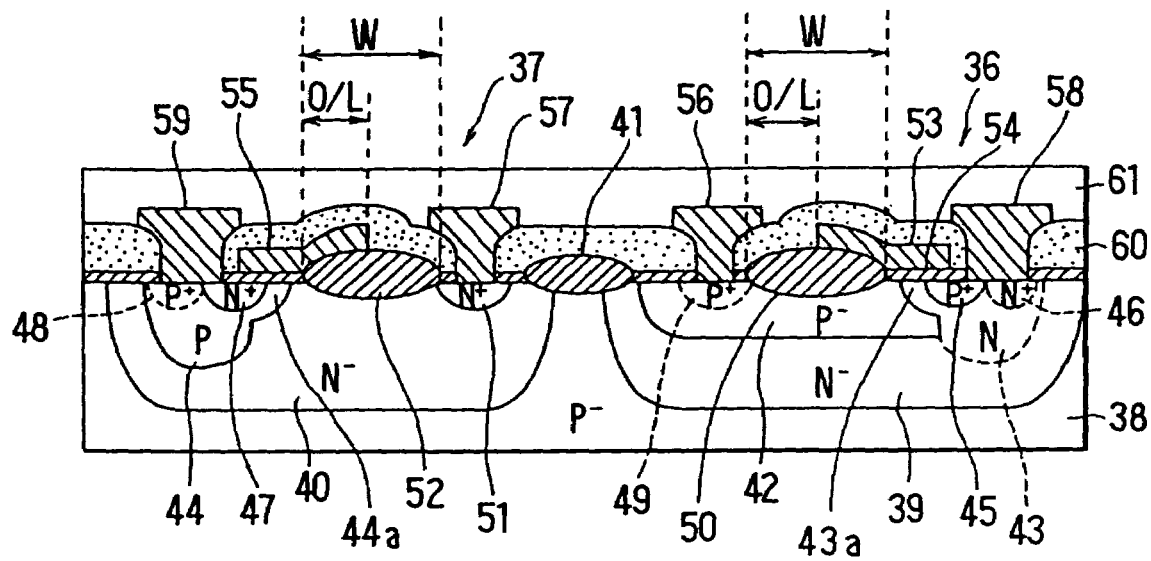
FIG. 8 is a schematic sectional view of a semiconductor device of a Third Embodiment according to the present invention.

FIG. 8 shows a third embodiment, which can obtain the same effects as the first embodiment. FIG. 8 shows a schematic sectional view.

In this embodiment, the present invention is adopted to a CMOS (Complementary Metal Oxide Semiconductor) structure, in which complementary LDMOSs 36, 37 are formed on an identical semiconductor substrate. In this case, the LDMOS 36 is a P-channel type, and the first conductivity type is P-type, and the second conductivity type is N-type, whereas the LDMOS 37 is a N-channel type, and the first conductivity type is N-type, and the second conductivity type is P-type.

As shown in FIG. 8, an N-type impurity diffusion layers 39, 40 are formed in a P-type monocrystal silicon substrate 38 in a manner the N-type impurity diffusion layers 39, 40 reach predetermined depths.

A LOCOS oxide film 41 is formed on the region between each impurity diffusion layers 39, 40 on the monocrystal silicon substrate 38. The LOCOS oxide film 41 is an insulating isolation film for electrically insulating between each impurity diffusion layers 39, 40. Here, one impurity diffusion layer 40 performs as a drift layer of the LDMOS 37, another impurity diffusion layer 39 performs as a forming region of the LDMOS 36. In this impurity diffusion layer 39, a P-type impurity diffusion layer 42 performing as a drift layer of the LDMOS 36 is formed.

A channel well layer 43 is formed in the monocrystal silicon substrate 38 by double-diffusing N-type impurities from a surface side of the impurity diffusion layer 42 so that a PN junction is generated between the channel well layer 43 and the impurity diffusion layer 42. A channel well layer 44 is formed in the monocrystal silicon substrate 38 by double-diffusing N-type impurities from a surface side of the impurity diffusion layer 40 so that a PN junction is generated between the channel well layer 44 and the impurity diffusion layer 40. Here, a junction depth of the channel well layer 43 is set to deep compared to that of the impurity diffusion layer 42, and a junction depth of the channel well layer 44 is set to shallow compared to that of the impurity diffusion layer 40.

A source diffusion layer 45 and a potential fixing diffusion layer 46 are formed in one channel well layer 43. The source diffusion layer 45 is formed by diffusing high concentration P-type impurities. The potential fixing diffusion layer 46 fixes a potential of the channel well layer 43, and is formed by diffusing high concentration N-type impurities. A source diffusion layer 47 and a potential fixing diffusion layer 48 are formed in another channel well layer 44. The source diffusion layer 47 is formed by diffusing high concentration N-type impurities. The potential fixing diffusion layer 48 fixes a potential of the channel well layer 44, and is formed by diffusing high concentration P-type impurities. In this case, a P-channel will be generated at a channel forming region 43a where between the source diffusion layer 45 and the PN junction among the impurity diffusion layer 42, and a N-channel will be generated at a channel forming region 44a where between the source diffusion layer 47 and the PN junction among the impurity diffusion layer 40.

A drain-contact layer 49 is formed in the impurity diffusion layer 42 by diffusing high concentration P-type impurities. A LOCOS oxide film 50 is formed on the impurity diffusion layer 42 between the channel well layer 43 and the drain-contact layer 49. The LOCOS oxide film 50 is an insulating isolation film for electrically insulating between the channel well layer 43 and the drain-contact layer 49. A drain-contact layer 51 is formed in the impurity diffusion layer 40 by diffusing high concentration N-type impurities. A LOCOS oxide film 52 is formed on the impurity diffusion layer 40 between the channel well layer 44 and the drain-contact layer 51. The LOCOS oxide film 52 is an insulating isolation film for electrically insulating between the channel well layer 44 and the drain-contact layer 51. In this embodiment, each of the width sizes W of the LOCOS oxide films 50, 52 are set to around 20 $\mu$m.

A gate electrode 53 made of polysilicon is formed on the channel forming region 43a of the channel well layer 43 with a gate oxide film 54 interposed therebetween. This gate electrode 53 is formed in a manner that a part of it overlaps onto the LOCOS oxide film 50 (protruded onto the LOCOS oxide films 50).

A gate electrode 55 made of polysilicon is formed on the channel forming region 44a of the channel well layer 44 with a gate oxide film 54 interposed therebetween. This gate electrode 55 is formed in a manner that a part of it overlaps onto the LOCOS oxide film 52 (protruded onto the LOCOS oxide films 52). In this case, each of the gate overlap lengths O/L of the gate electrodes 53, 55 is set to substantially 10 $\mu$m, which is a half of the width size W of corresponding LOCOS oxide film 50, 52.

Drain electrodes 56, 57 are formed on the drain-contact layers 49, 51 so as to have ohmic-contacts therebetween. A source electrodes 58 is formed on the source diffusion layer 45 and the potential fixing diffusion layer 46 so as to have an ohmic-contact therebetween. A source electrodes 59 is formed on the source diffusion layer 47 and the potential fixing diffusion layer 48 so as to have an ohmic-contact therebetween.

An interlayer insulating film 60 made of such as silicon oxide film is formed so as to cover the LOCOS oxide films 41, 50, 52 and gate electrodes 53, 55 and so on. Furthermore, a final passivation film 61 is formed so as to cover the interlayer insulating film 60, the drain electrodes 56, 57, and the source electrodes 58, 59.

According to this embodiment, since each of the overlap lengths O/L of the gate electrodes 53, 55 is set to substantially ½ of corresponding LOCOS oxide films 50, 52, the same effects as that of first embodiment can be obtained.

[Fourth Embodiment]

Figure 9:
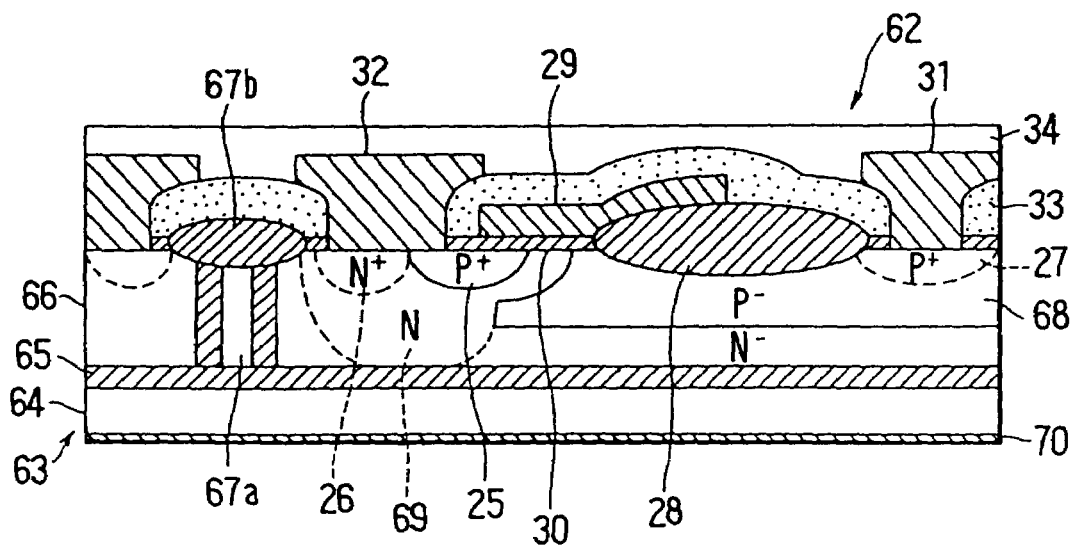
FIG. 9 is a schematic sectional view of a semiconductor device of a Fourth Embodiment according to the present invention.

FIG. 9 shows a fourth embodiment, which can obtain the same effects as the first embodiment.

In this embodiment, the present invention is adopted to a LDMOS 62 which constitutes an SOI structure. As shown in FIG. 9, which is a schematic sectional view, an SOI substrate 63 is formed from supporting substrate 64 made of such as monocrystal silicon, and N-type monocrystal silicon layer 66 formed on the SOI supporting substrate 64 with an insulating film 65 made of silicon oxide film interposed therebetween. In the monocrystal silicon layer 66, island regions are formed by being isolated from the other element forming region by an insulating isolation trench 67a and a LOCOS oxide film 67b. P-type impurity diffusion layers 68 are formed in each island regions so as to reach a predetermined depth. A channel well layer 69 is formed in the monocrystal silicon layer 66 by double-diffusing N-type impurities from the surface side of the impurity diffusion layer 68. The channel well layer 69 forms a PN junction at an interface with the impurity diffusion layer 68. Here, a junction depth of the channel well layer is set so as to reach the insulating film 65. In this embodiment, a back surface electrode 70 is formed on a back surface of the supporting substrate 64 to fix a potential of the supporting substrate 64 at a predetermined level.

A source diffusion layer 25 and a potential fixing diffusion layer 26, which are the same as those in the first embodiment, are formed in the channel well layer 69. A drain-contact layer 27 is formed in the impurity diffusion layer 68. Furthermore, LOCOS oxide film 28, a gate electrode 29, a drain electrode 31, a source electrode 32 and so on are formed.

According to this embodiment, since the gate electrode 29 having the same structure as in the first embodiment is formed, the same effects as that in the first embodiment is obtained. Furthermore, in this embodiment, since the back surface electrode 70 is formed to fix the potential of the supporting substrate at the predetermined level, it can control a spreading of a depletion layer from the insulating film 65 side, and then it can increase the drift current.

[Fifth Embodiment]

A fifth embodiment will be explained with reference to FIG. 10. The fifth embodiment shows a method of manufacturing a semiconductor device having a switching function such as the LDMOS, which has been explained in the first embodiment. Here, this method of manufacturing can be adapted not only LDMOS as in the first embodiment but also a DMOS (Double-diffused Metal Oxide Semiconductor) or the other semiconductor switching elements.

Figure 10:
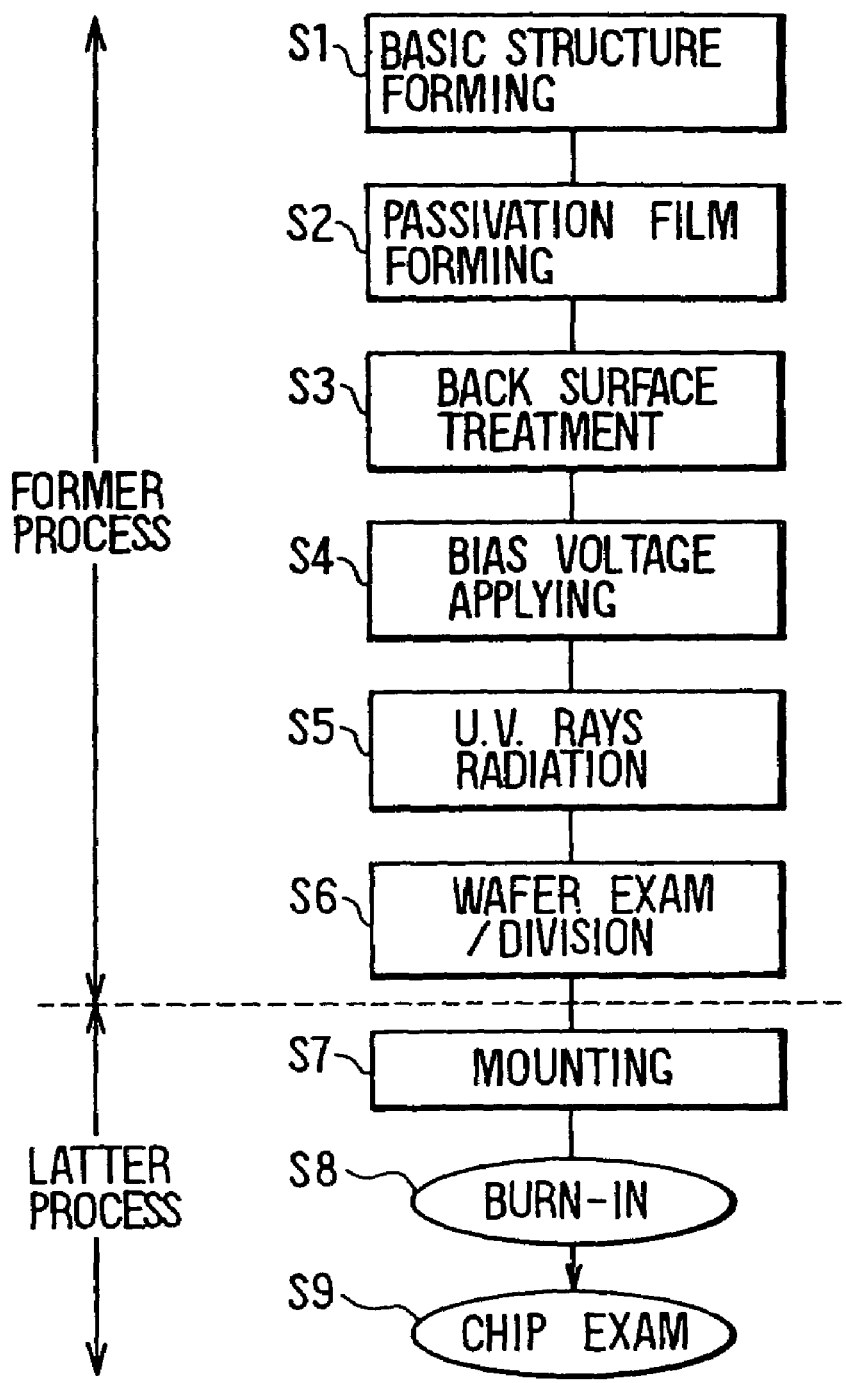
FIG. 10 is a flow chart illustrating a method of manufacturing of a Fifth Embodiment according to the present invention.

As shown in FIG. 10, a former process includes steps S1–S6, and a latter process includes steps S7–S9.

In the former process, at basic structure forming step S1, a basic structure of the semiconductor device is formed on the semiconductor wafer. At passivation film forming step S2, a final passivation film (for example, silicon nitride film), which can transmit ultra violet rays, is formed on an uppermost of the basic structure. At back surface treatment step S3, a back surface of the semiconductor wafer is flattened by such as grinding or polishing. After that, at bias voltage applying step S4, a bias voltage having a relatively high level voltage that can maintain the semiconductor device with off situation is applied to the semiconductor device for, for example, 10 to 20 minutes or more. At ultra violet rays radiation step S5, ultra violet rays having a band whose wave length of 253.7 nm are radiated to the basic structure of the semiconductor device through the final passivation film for, for example, 10 to 20 minutes or more.

After that, at wafer examination and division step S6, the semiconductor device is examined, and is divided into a plurality of semiconductor chips having predetermined shapes.

In the latter process, mounting step S7 includes assembling step in which each the divided semiconductor chips is assembled by using such as a lead flame, and packaging step. After that, at burn-in test step S8, a burn-in test as described the above is conducted on the assembled semiconductor ships. Finally, at chip examination step S9, the semiconductor chips are examined.

Next, effects of method of manufacturing of this embodiment will be explained hereinafter.

To investigate the effects, the following two different processes are conducted on sample, in which a final passivation film that can transmit ultra violet rays having a band whose wave length of 253.7 nm are formed on an uppermost of a basic structure of a P-channel type LDMOS, in its manufacturing process.

In a first process, ultra violet rays having a band whose wave length of 253.7 nm are radiated to the basic structure of the LDMOS through the final passivation film for 20 minutes, and then a bias voltage having a relatively high level voltage that can maintain the LDMOS with off situation is applied thereto for 20 minutes.

In a second process, a bias voltage having a relatively high level voltage that can maintain the LDMOS with off situation is applied thereto for 20 minutes, and then ultra violet rays having a band whose wave length of 253.7 nm are radiated to the basic structure of the LDMOS through the final passivation film for 20 minutes.

Each of the first and second processes, changes of the threshold voltage and drain current are measured. The results of measurement of the first process are shown in FIGS. 11A, 11B, and those of the second process are shown in FIGS. 12A, 12B.

Figure 11A:
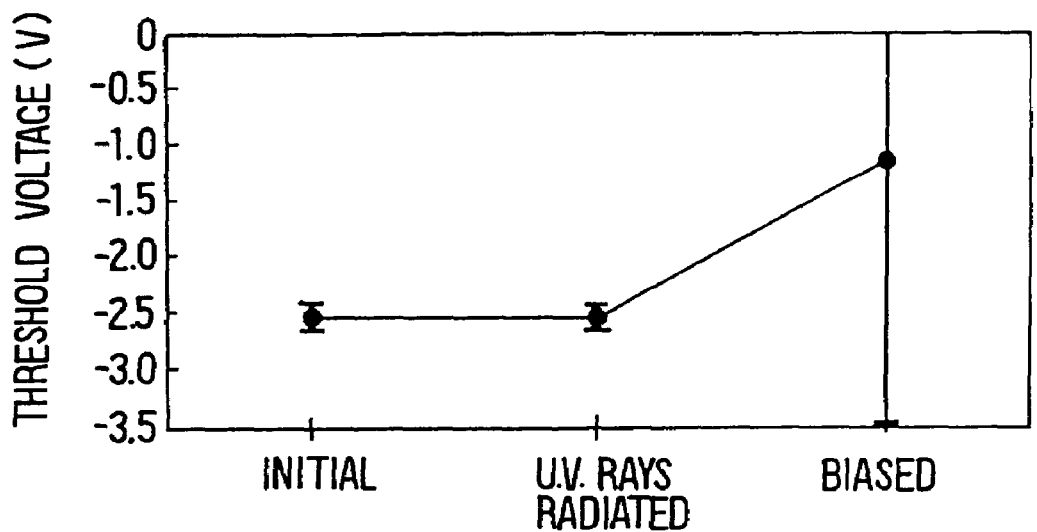
FIG. 11A is a diagram illustrating changes of a threshold voltage when a bias voltage is applied after ultra violet rays are radiated.
Figure 11B:
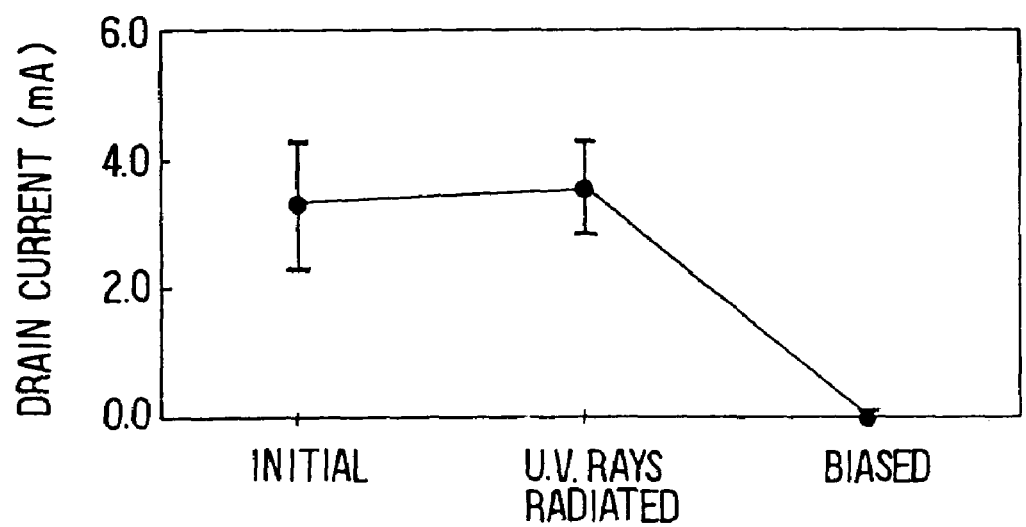
FIG. 11B is a diagram illustrating changes of a drain current when a bias voltage is applied after ultra violet rays are radiated.
Figure 12A:
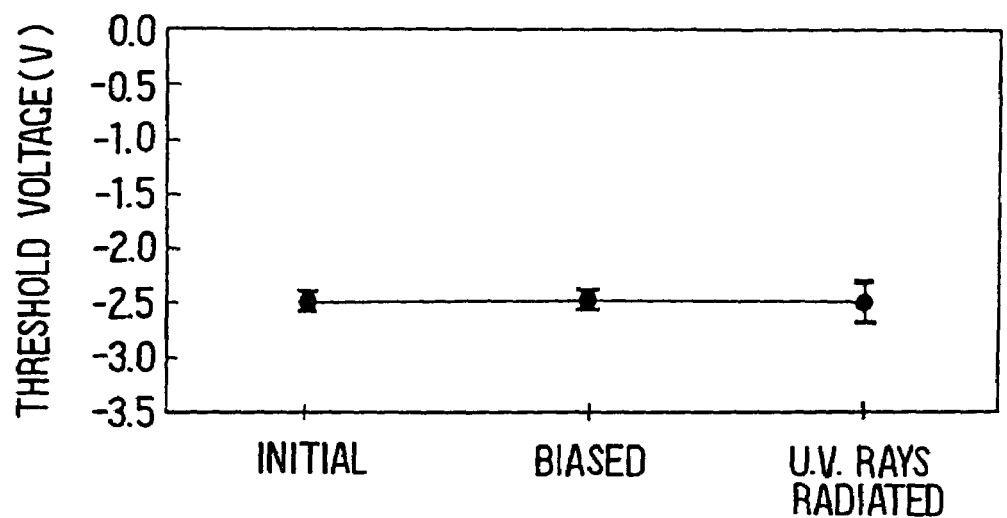
FIG. 12A is a diagram illustrating changes of a threshold voltage when ultra violet rays are radiated after a bias voltage is applied.
Figure 12B:
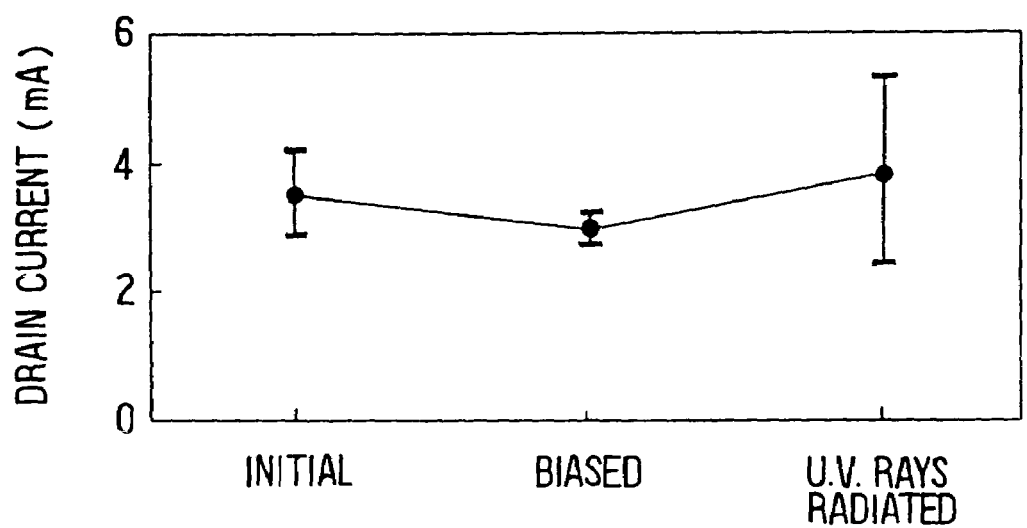
FIG. 12B is a diagram illustrating changes of a drain current when ultra violet rays are radiated after a bias voltage is applied.

As shown in FIGS. 11A, 11B, in the case in which the bias voltage is applied after ultra violet rays are radiated, the threshold voltage widely varies, and the drain current largely decreases to almost zero. On the contrary, as shown in FIGS. 12A, 12B, in the case in which ultra violet rays are radiated after the bias voltage is applied, the threshold voltage is maintained substantially constant, and drain current can be improved by the radiation of ultra violet rays after being slightly decreased due to the application of the bias voltage. In this case of FIG. 12B, the drain current is rather large compared to the initial drain current.

Furthermore, to confirm the effects of improvement of current capability when the ultra violet rays are radiated after the bias voltage is applied, the bias voltage is applied thereto again and changes of the threshold voltage and the drain current are measured. The results are shown in FIGS. 13A, 13B.

Figure 13A:
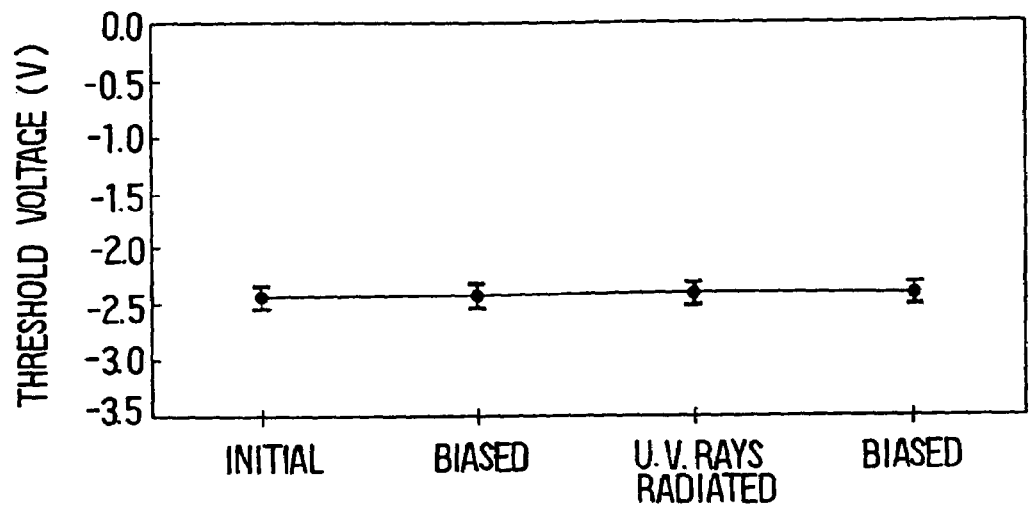
FIG. 13A is a diagram illustrating changes of a threshold voltage when a bias voltage is applied after ultra violet rays are radiated after a bias voltage is applied.
Figure 13B:
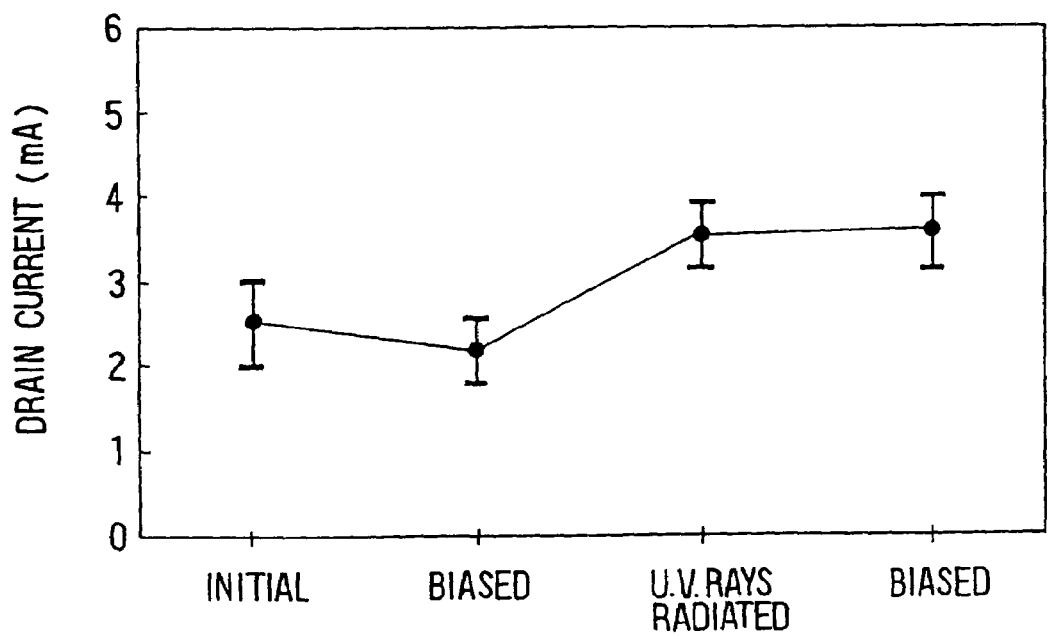
FIG. 13B is a diagram illustrating changes of a drain current when a bias voltage is applied after ultra violet rays are radiated after a bias voltage is applied.

According to FIGS. 13A, 13B, it is found that the threshold voltage and the drain current indicate almost no change, once the ultra violet rays are radiated after the bias voltage is applied.

Therefore, when the former process includes: the final passivation film which can transmit ultra violet rays is formed on the uppermost of the basic structure formed on the semiconductor wafer (S1, S2); the bias voltage having a relatively high level voltage that can maintain the semiconductor device with off situation is applied to the semiconductor device (S4); and ultra violet rays having a band whose wave length of 253.7 nm are radiated to the basic structure of the semiconductor device through the final passivation film (S5), like this embodiment, it can prevent the current capability from deterioration with time even if the semiconductor device is continuously operated for long time by the burn-in test or the like conducted after the former process.

[Sixth Embodiment]

A sixth embodiment will be explained with reference to FIG. 14. The sixth embodiment shows a method of manufacturing a semiconductor device having a switching function such as the LDMOS which has been explained in the first embodiment. Here, this method of manufacturing can be adapted not only LDMOS as in the first embodiment but also a DMOS (Double-diffused Metal Oxide Semiconductor) or the other semiconductor switching element.

Figure 14:
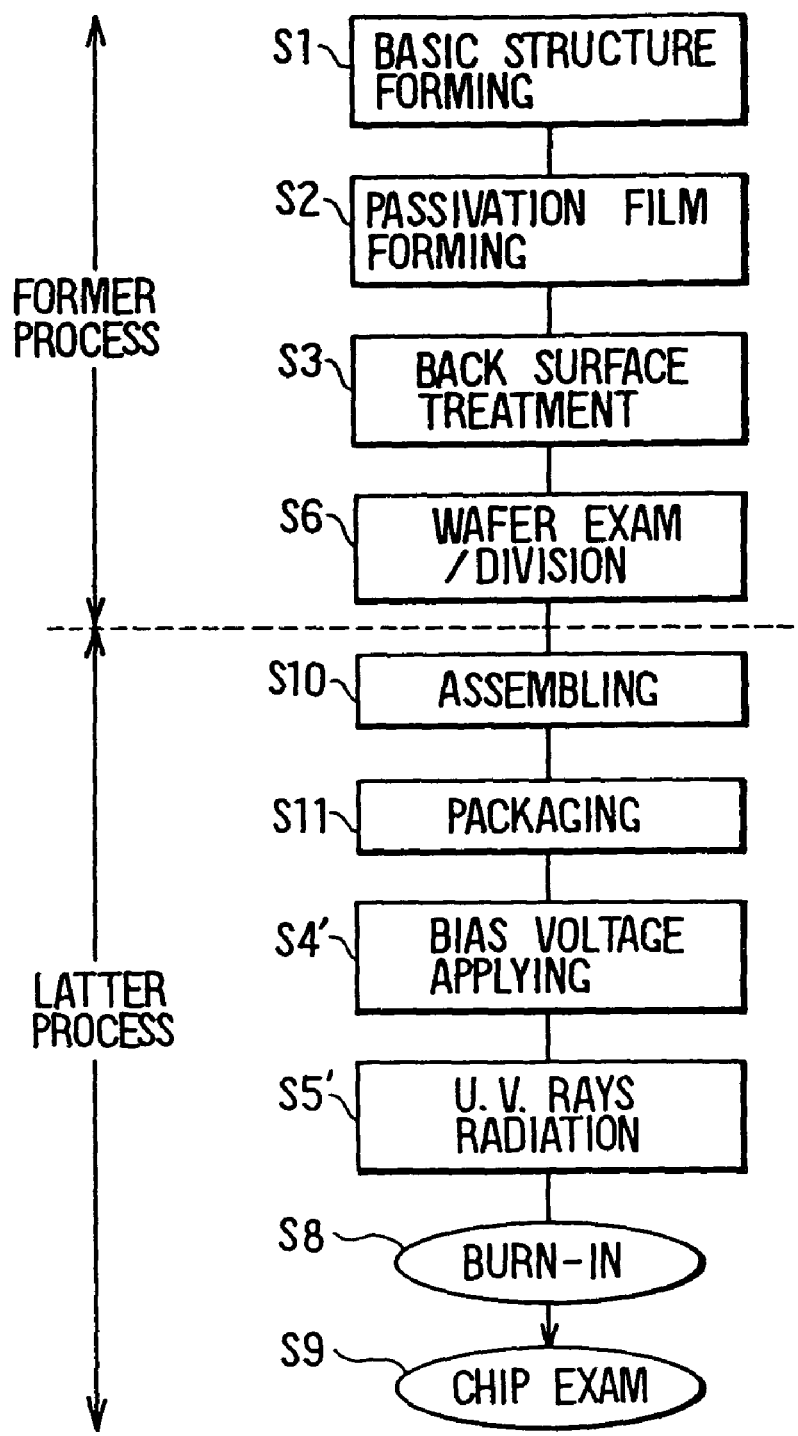
FIG. 14 is a flow chart illustrating a method of manufacturing of a Sixth Embodiment according to the present invention.
Figure 15:
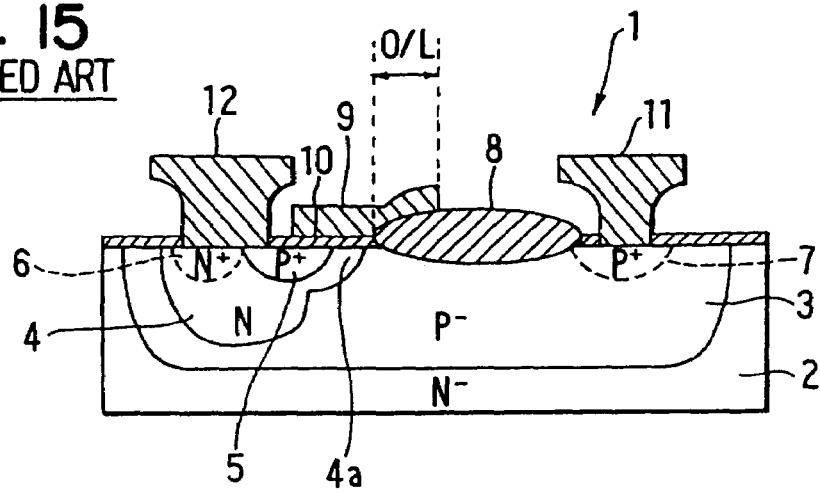
FIG. 15 is a schematic sectional view of a conventional semiconductor device.
Figure 16A:
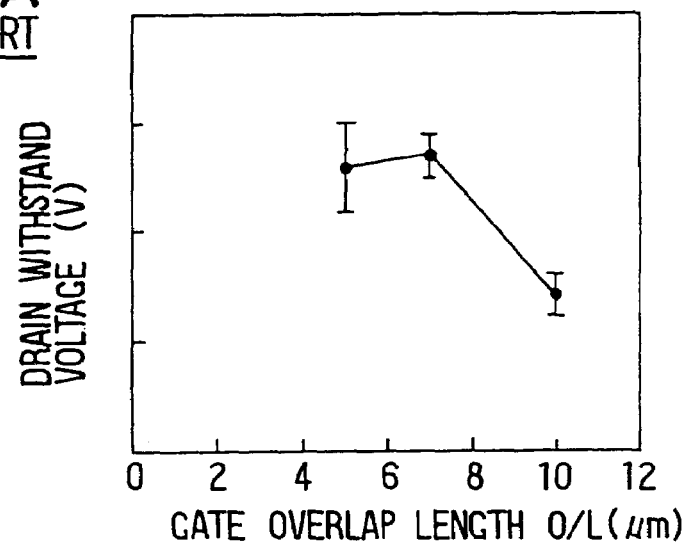
FIG. 16A is a graph illustrating a relation between a gate overlap length and a drain withstand voltage.
Figure 16B:
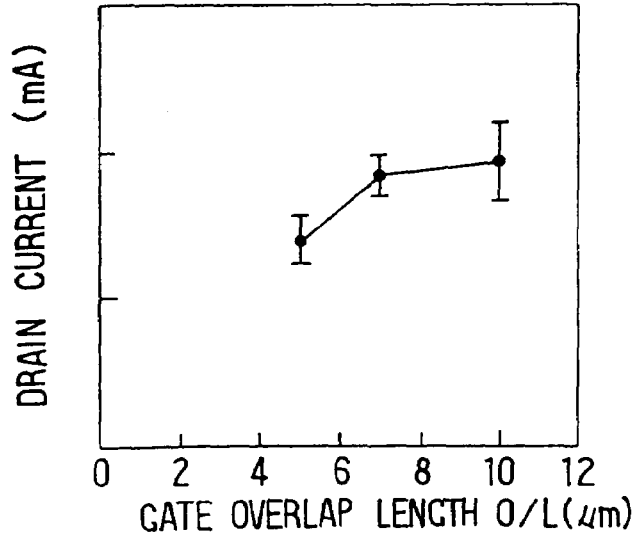
FIG. 16B is a graph illustrating a relation between a gate overlap length and a drain current.
Figure 17A:
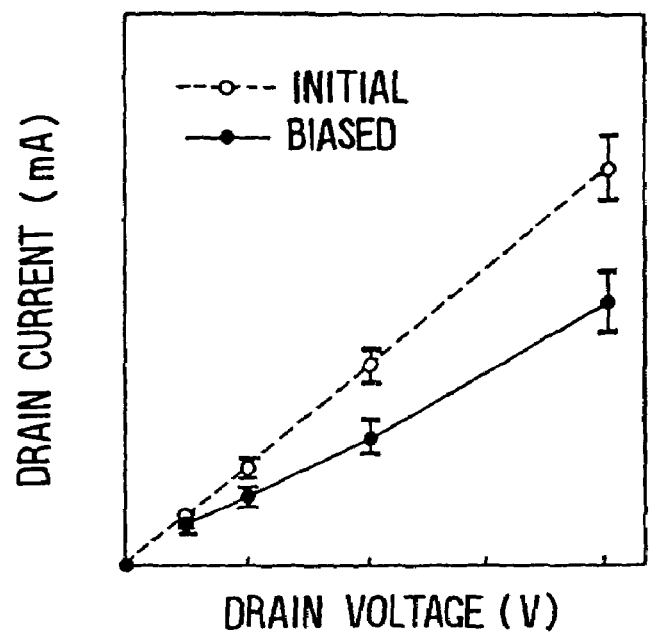
FIG. 17A is a graph illustrating a relation between a drain voltage and a drain current.
Figure 17B:
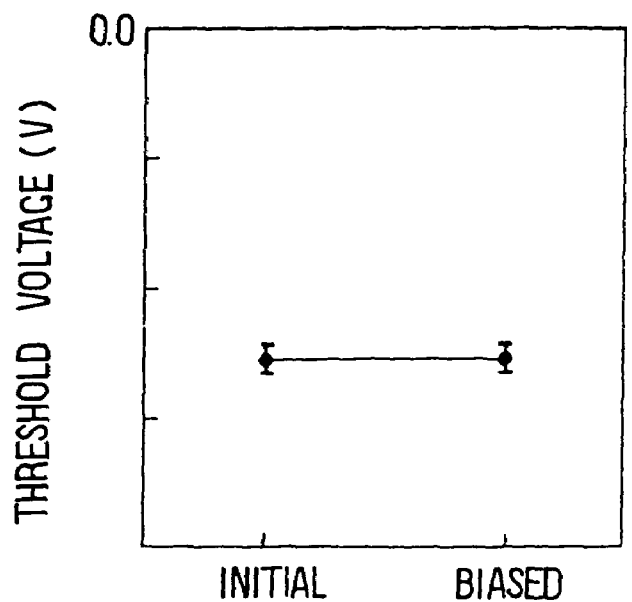
FIG. 17B is a diagram illustrating changes of a threshold voltage between before and after an application of a bias voltage.

As shown in FIG. 14, a former process includes steps S1–S3 and S6, and a latter process includes steps S10, S11, S4', S5', S8 and S9.

In the former process, at basic structure forming step S1, a basic structure of the semiconductor device is formed on the semiconductor wafer. At passivation film forming step S2, a final passivation film (for example, silicon nitride film), which can transmit ultra violet rays, is formed on an uppermost of the basic structure. At back surface treatment step S3, a back surface of the semiconductor wafer is flattened by such as grinding, polishing. After that, at wafer examination and division step S6, the semiconductor device is examined, and is divided into a plurality of semiconductor chips having predetermined shapes.

In the latter process, at assembling step S10, each the divided semiconductor chips is assembled by using such as a lead flame. At packaging step S11, the semiconductor chip is mounted on a package having a transmitting portion that can transmit ultra violet rays at least on the final passivation film side. After that, at bias voltage applying step S4', a bias voltage having a relatively high level voltage that can maintain the semiconductor device with off situation is applied to the semiconductor device for, for example, 10 to 20 minutes or more. At ultra violet rays radiation step S5', ultra violet rays having a band whose wave length of 253.7 nm are radiated to the basic structure of the semiconductor device through the transmitting portion of the package and the final passivation film for, for example, 10 to 20 minutes or more. After that, at burn-in test step S8, a burn-in test as described the above is conducted on the assembled semiconductor ships. Finally, at chip examination step S9, the semiconductor chips are examined.

According to this embodiment, ultra violet rays are radiated on the completed semiconductor device after once the bias voltage is applied thereto. Therefore, the threshold voltage and the drain current indicate almost no change even if the bias voltage is applied thereafter. Hence, it can prevent the current capability from deterioration with time even if the semiconductor device is continuously operated for long time as a result of actual operation.

[Modification]

The present invention can be modified or enlarged to the following structure as well as the first to the sixth embodiments.

In the first to the fourth embodiments, conductivity of each layer of the P-channel type LDMOS 21, 35, 36, 62 may be changed to opposite conductivity to form an N-channel type LDMOS. Here, in the case of the CMOS structure shown in the third embodiment, conductivity of each layer of the N-channel type LDMOS 37 is changed to opposite conductivity to form an P-channel type LDMOS. Furthermore, the present invention can be adapted to so-called a field MOS in which a part of the LOCOS oxide film as the insulating isolation film is used as the gate oxide film.

What is claimed is:

1. A method of manufacturing a semiconductor, comprising steps of:
   forming a basic structure of a semiconductor device on a semiconductor wafer;
   forming a final passivation film that transmits ultra violet rays on an uppermost of the basic structure;
   applying a bias voltage to the semiconductor device;
   maintaining the bias voltage for a first predetermined time at a predetermined level to maintain the semiconductor device in an off state; and
   radiating ultra violet rays to the basic structure of the semiconductor device through the final passivation film for a second predetermined time after the step of the bias voltage.

2. A method of manufacturing a semiconductor device, according to claim 1, further comprising:
   dividing the semiconductor device into a plurality of semiconductor chips; and
   mounting each of the semiconductor chips on a package having a transmitting portion that can transmit ultra violet rays at least on the final passivation film side.

3. A method of manufacturing a semiconductor according to claim 2, wherein:
   the semiconductor is a switching element selected from one of a LDMOS FET (Lateral Double-Diffused Metal Oxide Semiconductor Field effect Transistor) and a VDMOS FET (Vertical Double-Diffused Metal Oxide Semiconductor Field effect Transistor); and
   the bias voltage applying step applies the bias voltage between a source and a drain of the switching element.

4. A method of manufacturing a semiconductor according to claim 2, wherein the ultra violet rays radiation step radiates ultra violet rays having a band whose wave length of 253.7 nm.

5. A method of manufacturing a semiconductor device according to claim 2, wherein the step of forming the basic structure includes:
   forming a transistor structure, formed in a semiconductor substrate defined in said semiconductor wafer, comprising a drain region, a source region formed in a channel well layer and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:
   the gate electrode is formed so as to extend toward the drain region to have a portion overlapping with the insulating isolation film, and said gate electrode is formed so that a maximum electric field point in the neighborhood of a surface of the semiconductor substrate occurs at substantially the center portion of a region corresponding to the insulating isolation film, when a predetermined bias voltage is applied between the source region and the drain region, and the source region and the gate electrode are at substantially identical potential.

6. A method of manufacturing a semiconductor device according to claim 5, wherein said gate electrode is formed so that a protrusion amount onto the insulating isolation film is set equal to or more than substantially a half of a width size of the insulating isolation film.

7. A method of manufacturing a semiconductor device according to claim 6, wherein said gate electrode is formed so that a protrusion amount onto the insulating isolation film is set equal to substantially a half of a width size of the insulating isolation film.

8. A method of manufacturing a semiconductor device according to claim 5, wherein the step of forming the basic structure includes:
   preparing an SOI substrate wafer formed from a supporting substrate and a semiconductor layer with an insulating film interposed therebetween, wherein said transistor structure is formed in said semiconductor layer.

9. A method of manufacturing a semiconductor device according to claim 8, wherein the supporting substrate is made of semiconductor material, and the supporting substrate includes a potential fixing electrode formed on its back surface to fix a potential of the supporting substrate with a predetermined level.

10. A method of manufacturing a semiconductor device according to claim 2, wherein the step of forming the basic structure includes:
    forming a transistor structure, formed in a semiconductor substrate defined in said semiconductor wafer, comprising a drain region, a source region formed in a channel well layer and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:
    the gate electrode extends toward the drain region so as to have a portion overlapping with the insulating isolation film, and said gate electrode is formed so that a peak carrier generation rate in the neighborhood of a surface of the semiconductor substrate occurs at lower region corresponding to the insulating isolation film, when a predetermined bias voltage is applied between the source region and the drain region, and the source region and the gate electrode are at substantially identical potential.

11. A method of manufacturing a semiconductor device according to claim 10, wherein said gate electrode is formed so that a protrusion amount onto the insulating isolation film is set equal to or more than substantially a half of a width size of the insulating isolation film.

12. A method of manufacturing a semiconductor device according to claim 11, wherein said gate electrode is formed so that a protrusion amount onto the insulating isolation film is set equal to substantially a half of a width size of the insulating isolation film.

13. A method of manufacturing a semiconductor device according to claim 2, wherein the step of forming the basic structure includes:
    forming a transistor structure, formed in a semiconductor substrate defined in said semiconductor wafer, comprising a drain region, a source region formed in a channel well layer and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:
    the gate electrode extends toward the drain region so as to have a portion overlapping with the insulating isolation film, and said gate electrode is formed so that a carrier flow in the neighborhood of a surface of the semiconductor substrate contains a component toward an opposite side direction of the insulating isolation film, when a predetermined bias voltage is applied between the source region and the drain region, and the source region and the gate electrode are at substantially identical potential.

14. A method of manufacturing a semiconductor device according to claim 13, wherein said gate electrode is formed so that a protrusion amount onto the insulating isolation film is set equal to or more than substantially a half of a width size of the insulating isolation film.

15. A method of manufacturing a semiconductor device according to claim 14, wherein said gate electrode is formed so that a protrusion amount onto the insulating isolation film is set equal to substantially a half of a width size of the insulating isolation film.

16. A method of manufacturing a semiconductor device according to claim 2, wherein the step of forming the basic structure includes:
  forming a transistor structure, formed in a semiconductor substrate defined in said semiconductor wafer, comprising a drain region having a P-type conductivity, a source region, formed in a channel well layer of a N-type conductivity, having a P-type conductivity, and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:
  the gate electrode is disposed at a side of said insulating isolation film opposite to a location where the drain region is formed, the gate electrode extends toward the drain region so as to have a portion overlapping with the insulating isolation film, and said gate electrode is formed so that a maximum electric field point in the neighborhood of a surface of the semiconductor substrate occurs at substantially the center portion of a region corresponding to the insulating isolation film, when a predetermined bias voltage is applied between the source region and the drain region, and the source region and the gate electrode are at substantially identical potential.

17. A method of manufacturing a semiconductor according to claim 1, wherein:
  the semiconductor is a switching element selected from one of a LDMOS FET (Lateral Double-Diffused Metal Oxide Semiconductor Field effect Transistor) and a VDMOS FET (Vertical Double-Diffused Metal Oxide Semiconductor Field effect Transistor); and
  the bias voltage applying step comprises applying the bias voltage between a source and a drain of the switching element.

18. A method of manufacturing a semiconductor according to claim 1, wherein the ultra violet rays radiation step comprises radiating ultra violet rays having a band whose wave length of 253.7 nm.

19. A method of manufacturing a semiconductor device according to claim 1, wherein the step of forming the basic structure includes:
  forming a transistor structure, formed in a semiconductor substrate defined in said semiconductor wafer, comprising a drain region, a source region formed in a channel well layer and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:
  the gate electrode is formed so as to extend toward the drain region to have a portion overlapping with the insulating isolation film, and said gate electrode is formed so that a maximum electric field point in the neighborhood of a surface of the semiconductor substrate occurs at substantially the center portion of a region corresponding to the insulating isolation film, when a predetermined bias voltage is applied between the source region and the drain region, and the source region and the gate electrode are at substantially identical potential.

20. A method of manufacturing a semiconductor device according to claim 19, wherein said gate electrode is formed so that a protrusion amount onto the insulating isolation film is set equal to or more than substantially a half of a width size of the insulating isolation film.

21. A method of manufacturing a semiconductor device according to claim 20, wherein said gate electrode is formed so that a protrusion amount onto the insulating isolation film is set equal to substantially a half of a width size of the insulating isolation film.

22. A method of manufacturing a semiconductor device according to claim 19, wherein the step of forming the basic structure includes:
  preparing an SOI substrate wafer formed from a supporting substrate and a semiconductor layer with an insulating film interposed therebetween, wherein said transistor structure is formed in said semiconductor layer.

23. A method of manufacturing a semiconductor device according to claim 22, wherein the supporting substrate is made of semiconductor material, and the supporting substrate includes a potential fixing electrode formed on its back surface to fix a potential of the supporting substrate with a predetermined level.

24. A method of manufacturing a semiconductor device according to claim 1, wherein the step of forming the basic structure includes:
  forming a transistor structure, formed in a semiconductor substrate defined in said semiconductor wafer, comprising a drain region, a source region formed in a channel well layer and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:
  the gate electrode extends toward the drain region so as to have a portion overlapping with the insulating isolation film, and said gate electrode is formed so that a peak carrier generation rate in the neighborhood of a surface of the semiconductor substrate occurs at lower region corresponding to the insulating isolation film, when a predetermined bias voltage is applied between the source region and the drain region, and the source region and the gate electrode are at substantially identical potential.

25. A method of manufacturing a semiconductor device according to claim 24, wherein said gate electrode is formed so that a protrusion amount onto the insulating isolation film is set equal to or more than substantially a half of a width size of the insulating isolation film.

26. A method of manufacturing a semiconductor device according to claim 25, wherein said gate electrode is formed so that a protrusion amount onto the insulating isolation film is set equal to substantially a half of a width size of the insulating isolation film.

27. A method of manufacturing a semiconductor device according to claim 1, wherein the step of forming the basic structure includes:

forming a transistor structure, formed in a semiconductor substrate defined in said semiconductor wafer, comprising a drain region, a source region formed in a channel well layer and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:

the gate electrode extends toward the drain region so as to have a portion overlapping with the insulating isolation film, and said gate electrode is formed so that a carrier flow in the neighborhood of a surface of the semiconductor substrate contains a component toward an opposite side direction of the insulating isolation film, when a predetermined bias voltage is applied between the source region and the drain region, and the source region and the gate electrode are at substantially identical potential.

28. A method of manufacturing a semiconductor device according to claim 27, wherein said gate electrode is formed so that a protrusion amount onto the insulating isolation film is set equal to or more than substantially a half of a width size of the insulating isolation film.

29. A method of manufacturing a semiconductor device according to claim 28, wherein said gate electrode is formed so that a protrusion amount onto the insulating isolation film is set equal to substantially a half of a width size of the insulating isolation film.

30. A method of manufacturing a semiconductor device according to claim 1, wherein the step of forming the basic structure includes:

forming a transistor structure, formed in a semiconductor substrate defined in said semiconductor wafer, comprising a drain region having a P-type conductivity, a source region, formed in a channel well layer of a N-type conductivity, having a P-type conductivity, and a gate electrode, formed on the semiconductor substrate, with a gate oxide film interposed between said gate electrode and a channel forming region formed in said channel well layer, said transistor structure further comprising an insulating isolation film formed between said drain region and said channel well layer, wherein:

the gate electrode is disposed at a side of said insulating isolation film opposite to a location where the drain region is formed, the gate electrode extends toward the drain region so as to have a portion overlapping with the insulating isolation film, and said gate electrode is formed so that a maximum electric field point in the neighborhood of a surface of the semiconductor substrate occurs at substantially the center portion of a region corresponding to the insulating isolation film, when a predetermined bias voltage is applied between the source region and the drain region, and the source region and the gate electrode are at substantially identical potential.

* * * * *